United States Patent
Im et al.

(10) Patent No.: US 7,724,600 B1
(45) Date of Patent: May 25, 2010

(54) ELECTRONIC FUSE PROGRAMMING CURRENT GENERATOR WITH ON-CHIP REFERENCE

(75) Inventors: Hsung Jai Im, Cupertino, CA (US);
Sunhom Paak, San Jose, CA (US);
Boon Yong Ang, Santa Clara, CA (US)

(73) Assignee: XILINX, Inc., San Jose, CA (US)

( * ) Notice: Subject to any disclaimer, the term of this patent is extended or adjusted under 35 U.S.C. 154(b) by 120 days.

(21) Appl. No.: 12/043,091

(22) Filed: Mar. 5, 2008

(51) Int. Cl.
*G11C 17/18* (2006.01)

(52) U.S. Cl. .................... 365/225.7; 365/96
(58) Field of Classification Search ........... 365/225.7, 365/96, 100, 189.09; 327/525, 543; 326/38
See application file for complete search history.

(56) References Cited

U.S. PATENT DOCUMENTS

| | | |
|---|---|---|
| 4,219,836 A | 8/1980 | McElroy |
| 4,238,839 A | 12/1980 | Redfern et al. |
| 4,647,340 A | 3/1987 | Szluk et al. |
| 4,872,140 A | 10/1989 | Graham et al. |
| 5,166,758 A | 11/1992 | Ovshinsky et al. |
| 6,008,673 A | 12/1999 | Glass et al. |
| 6,060,743 A | 5/2000 | Sugiyama et al. |
| 6,258,700 B1 | 7/2001 | Bohr et al. |
| 6,384,664 B1 | 5/2002 | Hellums et al. |
| 6,384,666 B1 * | 5/2002 | Bertin et al. ............ 327/525 |
| 6,496,416 B1 | 12/2002 | Look |
| 6,522,582 B1 | 2/2003 | Rao et al. |
| 6,525,397 B1 | 2/2003 | Kalnitsky et al. |
| 6,597,013 B2 | 7/2003 | Romas, Jr. et al. |
| 6,671,205 B2 | 12/2003 | Look |
| 6,703,680 B2 | 3/2004 | Toyoshima |
| 6,804,159 B2 | 10/2004 | Kamiya et al. |
| 6,807,079 B2 | 10/2004 | Mei et al. |
| 6,882,571 B1 | 4/2005 | Look |
| 6,911,360 B2 | 6/2005 | Li et al. |
| 6,930,920 B1 | 8/2005 | Look |
| 6,936,527 B1 | 8/2005 | Look |
| 6,995,601 B2 | 2/2006 | Huang et al. |
| 7,009,443 B2 | 3/2006 | Illegems |
| 7,026,692 B1 | 4/2006 | Look |
| 7,061,304 B2 * | 6/2006 | Anand et al. ............ 327/525 |
| 7,068,072 B2 | 6/2006 | New et al. |
| 7,092,273 B2 | 8/2006 | Look |
| 7,098,721 B2 | 8/2006 | Ouellette et al. |

(Continued)

OTHER PUBLICATIONS

U.S. Appl. No. 12/043,910, filed Mar. 6, 2008, Im, Hsung Jai et al., Xilinx, Inc. 2100 Logic Drive, San Jose, CA 95124.

(Continued)

*Primary Examiner*—Vu A Le
(74) *Attorney, Agent, or Firm*—Scott Hewett; Thomas George

(57) ABSTRACT

An integrated circuit includes an electronic fuse ("E-fuse") cell having a fuse link and an E-fuse programming current generator. The fuse link has a width ($FL_w$) and a thickness ($FL_T$) and is fabricated from a layer of link material. An E-fuse programming current generator includes a reference link array having a plurality of reference links. Each of the reference links has the fuse link width and the fuse link thickness, and is fabricated from the layer of link material.

20 Claims, 6 Drawing Sheets

U.S. PATENT DOCUMENTS

| | | | |
|---|---|---|---|
| 7,180,102 | B2 | 2/2007 | Hui |
| 7,224,633 | B1 | 5/2007 | Hovis et al. |
| 7,307,911 | B1 | 12/2007 | Anand et al. |
| 7,405,590 | B1 * | 7/2008 | Kaneko ..................... 326/38 |
| 2004/0124458 | A1 | 7/2004 | Kothandaraman |
| 2009/0179302 | A1 * | 7/2009 | Kothandaraman et al. ... 257/529 |

OTHER PUBLICATIONS

Toyoji Yamamoto et al., "Bias Temperature Instability in Scaled p+ Polysilicon Gate p-MOSFET's," IEEE Transactions on Electron Devices, vol. 46, No. 5, May 1999, IEEE, 3 Park Avenue, 17th Floor, New York, NY 10016-5997.

Se-Aug Jang et al., "Effects of Thermal Processes After Silicidation on the Performance of TiSi2/Polysilicon Gate Device," IEEE Transactions on Electron Devices, vol. 46, No. 12, Dec. 1999, pp. 2353-2356, IEEE, 3 Park Avenue, 17th Floor, New York, NY 10016-5997.

Rahman, Arifur et al., "Die Stacking Technology for Terabit Chip-to-Chip Communications", Proceedings of 2006 IEEE Custom Integrated Circuits Conference (CICC), Sep. 10-13, 2006, available from IEEE, 3 Park Avenue, 17th Floor, New York, NY 10016-5997.

N. Kimizuka et al., "NBTI enchancement by nitrogen incorporation into ultrathin gat oxide for 0.10-um gate CMOS generation," 2000 Symposium on VLSI Technology Digest of Technical Papers, Apr. 2000, pp. 92-93, IEEE, 3 Park Avenue, 17th Floor, New York, NY 10016-5997.

Mohsen Alavi et al., A PROM Element Based on Salicide Agglomeration of Poly Fuses in a CMOS Logic Process, Jul. 1997, pp. 855-858, IEEE, 3 Park Avenue, 17th Floor, New York, NY 10016-5997.

Jerome B. Lasky et al., "Comparison of Transformation to Low-Resistivity Phase and Agglomeration of TiSi2 and CoSi2," IEEE Transactions on Electron Devices, vol. 38, No. 2, Feb. 1991, pp. 262-269, IEEE, 3 Park Avenue, 17th Floor, New York, NY 10016-5997.

Alexander Kalnitzky et al., CoSi2 integrated fuses on poly silicon for low voltage 0.18um CMOS applications, Sep. 1999, pp. 765-768 IEEE, 3 Park Avenue, 17th Floor, New York, NY 10016-5997.

U.S. Appl. No. 12/043,914, filed Mar. 6, 2008, Im, Hsung Jai et al., Xilinx, Inc. 2100 Logic Drive, San Jose, CA 95124.

U.S. Appl. No. 12/043,103, filed Mar. 5, 2008, Im, Hsung Jai, et al., Xilinx, Inc. 2100 Logic Drive, San Jose, CA 95124.

U.S. Appl. No. 12/043,099, filed Mar. 5, 2008, Im, Hsung Jai et al., Xilinx, Inc. 2100 Logic Drive, San Jose, CA 95124.

U.S. Appl. No. 12/043,914, filed Mar. 6, 2008, Im, Hsung Jai et al., Xilinx, Inc. 2100 Logic Drive, San Jose, CA 95124.

U.S. Appl. No. 11/973,062, filed Oct. 4, 2007, Rahman, Arifur et al., Xilinx, Inc. 2100 Logic Drive, San Jose, CA 95124.

U.S. Appl. No. 11/799,886, filed May 2, 2007, Sidhu, Lakhbeer S. et al., Xilinx, Inc. 2100 Logic Drive, San Jose, CA 95124.

U.S. Appl. No. 11/717,836, filed Mar. 13, 2007, Oh, Kwansuhk, et al., Xilinx, Inc. 2100 Logic Drive, San Jose, CA 95124.

U.S. Appl. No. 11/588,775, filed Oct. 27, 2006, Paak, Sunhom et al., Xilinx, Inc. 2100 Logic Drive, San Jose, California 95124.

U.S. Appl. No. 11/449,171, filed Jun. 8, 2006, Ang, Boon Yong et al., Xilinx, Inc. 2100 Logic Drive, San Jose, California 95124.

* cited by examiner

ELECTRONIC FUSE PROGRAMMING CURRENT GENERATOR WITH ON-CHIP REFERENCE

FIELD OF THE INVENTION

This invention relates generally to integrated circuits ("ICs"), and more particularly to programming an electronic fuse ("E-fuse") used to store non-volatile data in an IC.

BACKGROUND OF THE INVENTION

Many ICs are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as CMOS memory, antifuse memory, and E-fuse memory.

One-time-programmable ("OTP") memory elements are used in ICs to provide non-volatile memory ("NVM"). Data in NVM are not lost when the IC is turned off. NVM allows an IC manufacturer to store lot number and security data on the IC, for example, and is useful in many other applications. One type of NVM is commonly called an E-fuse.

E-fuses are usually integrated into semiconductor ICs by using a narrow stripe (commonly also called a "fuse link") of conducting material (metal, poly-silicon, etc.) between two pads, generally referred to as anode and cathode. Applying a programming current ($I_{prog}$) to the E-fuse destroys (fuses) the link, thus changing the resistance of the E-fuse. This is commonly referred to as "programming" the E-fuse. The fuse state (i.e., whether it has been programmed) can be read using a sense circuit, which is common in the art of electronic memories.

FIG. 1A is a plan view of an E-fuse 100. The E-fuse 100 has a fuse link 102 between an anode 104 and a cathode 106. The anode, fuse link, and cathode are typically polysilicon or silicided polysilicon formed entirely on relatively thick field oxide or isolation oxide. Contacts (not shown) provide electrical terminals to the anode and cathode. The fuse link has a fuse link length $FL_L$ and a fuse link width $FL_W$. The fuse link has a relatively small cross section, which is essentially defined by the thickness of the material in which the fuse link is formed in and by the fuse link width. The fuse link width $FL_W$ is often the critical dimension (e.g., minimum polysilicon dimension) of the technology used to fabricate the IC. The small cross section of the fuse link results in Joule heating of the link during programming to convert the E-fuse to a high resistance state.

The terms "anode" and "cathode" are used for purposes of convenient discussion. Whether a terminal of an E-fuse operates as an anode or a cathode depends upon how the programming current is applied. Programming of the E-fuse can be facilitated by the physical layout. For example, the cathode 106 is larger than the fuse link 102, which generates localized Joule heating in the fuse link during programming.

During programming, current is applied through the fuse link for a specified period. The programming current heats up the fuse link more than the adjacent areas due to current crowding and differences in heat dissipation, creating a temperature gradient. The temperature gradient and the carrier flux causes electro- and stress-migration to take place and drive material (e.g., silicide, dopant, and polysilicon) away from the fuse link.

Programming generally converts the E-fuse from an original resistance to a programmed resistance. It is desirable for the programmed resistance to be much higher (typically many orders of magnitude higher) than the original resistance to allow reliable reading of the E-fuse using a sensing circuit. A first logic state (e.g., a logical "0") is typically assigned to an unprogrammed, low-resistance (typically about 200 Ohms) fuse state, and a second logic state (e.g., a logical "1") to the programmed, high-resistance (typically greater than 100,000 Ohms) fuse state. The change in resistance is sensed (read) by a sensing circuit to produce a data bit.

FIG. 1B is a side view of the E-fuse 100 of FIG. 1A. The E-fuse 100 is fabricated from a layer of link material 101 that is deposited on the IC substrate and patterned using photolithographic techniques to define the anode 104, cathode 106, and fuse link 102. The fuse link 102 has a fuse link thickness $FL_T$ that is essentially the thickness of the layer of link material 101. The E-fuse is on field oxide 108 that is formed on semiconductor material 110 (e.g., silicon).

E-fuse elements are particularly useful due to their simplicity, low manufacturing cost, and easy integration into CMOS ICs using conventional CMOS fabrication techniques. Conventional programming techniques use an on-chip current generator and an external resistor to set the desired programming current level. However, incorrect programming current can result in improperly programmed bits, and correct programming current is critical in obtaining high programming yield. Incorrect (high) programming current can also cause physical damage to structures near the E-fuse. Other problems arise when ICs are scaled to smaller design geometries (node spacings) because the programming conditions for one design geometry might not be optimal for another design geometry, undesirably reducing programming yield or increasing programming time. It is desirable to provide E-fuse techniques that overcome the problems of the prior art.

SUMMARY OF THE INVENTION

An integrated circuit includes an electronic fuse ("E-fuse") cell having a fuse link. The fuse link width and a thickness and is fabricated from a layer of link material. An E-fuse programming current generator includes a reference link array having a plurality of reference links. Each of the reference links has the fuse link width and the fuse link thickness, and is fabricated from the layer of link material.

DETAILED DESCRIPTION OF THE DRAWINGS

Figure 2:
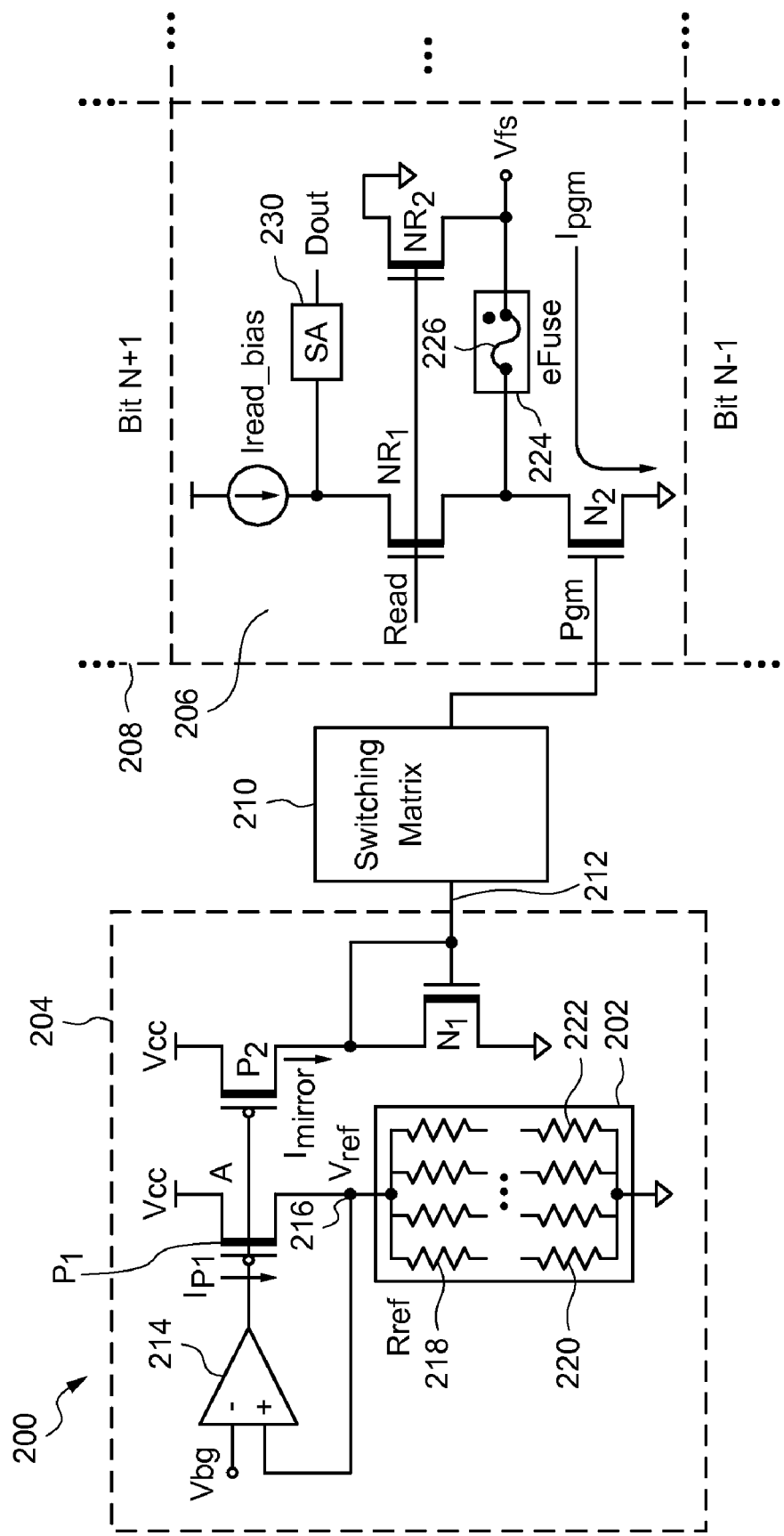
FIG. 2 is a circuit diagram of a portion of an IC with an E-fuse reference link array according to an embodiment.

FIG. 2 is a circuit diagram of a portion of an IC 200 with an E-fuse reference link array 202 according to an embodiment. The reference link array 202 is in a E-fuse programming current generator 204 that is selectively coupled to an E-fuse cell ("bit") 206 in an E-fuse memory array 208 through a switching matrix 210. In a particular embodiment, the switching matrix 210 selectively couples the output 212 of the E-fuse current generator 204 to one of several E-fuses in an E-fuse memory array 208 using word-line/bit-line techniques. The switching matrix 210 is controlled by logic (not shown) on or off the IC that couples the output of the E-fuse programming current generator to a selected E-fuse cell in the memory array for a selected period (i.e., for the desired programming time, Tpgm). In an exemplary embodiment, the E-fuses in the memory array that are to be programmed are programmed sequentially (one at a time) using the E-fuse programming current generator. It is desirable, but not essential, that the E-fuse programming current generator 204 be physically near the E-fuse memory array 208 to obtain good transistor matching between N1 and N2.

The E-fuse programming current generator 204 has an operational amplifier ("OpAmp") 214 that compares a reference voltage $V_{REF}$ at node 216 with a band gap voltage source $V_{bg}$, which provides a stable voltage. Note that other sources of a stable voltage, such as a regulated external voltage, may be substituted for a band gap voltage source. The reference voltage $V_{REF}$ is established by the current $I_{P1}$ through transistor P1 and the resistance of the E-fuse reference link array 202. The OpAmp 214 does not draw input current, and drives the gate of P1 until Vbg=$V_{REF}$. The OpAmp 214 also drives the gate of P2 to produce a current $I_{mirror}$ that is essentially equal to $I_{P1}$ if the widths of P1 and P2 are identical, disregarding the slight additional series resistance of N1. Alternatively, P2 is scaled (e.g., greater channel width) to account for the added resistance through N1. In an alternative embodiment, $I_{mirror}$ is not equal or essentially equal to $I_{P1}$, but rather is intentionally scaled to be substantially greater than or less than $I_{P1}$, such as by increasing or decreasing the gate width of P2 relative to P1.

Figure 1A:
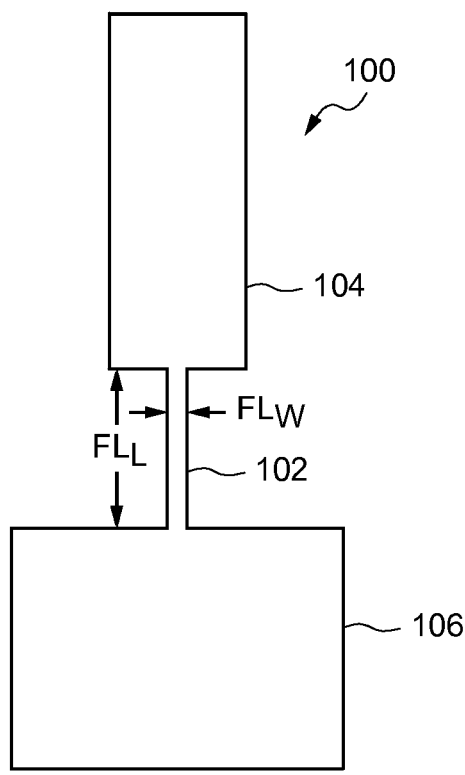
FIG. 1A is a plan view of a prior art E-fuse.
Figure 1B:
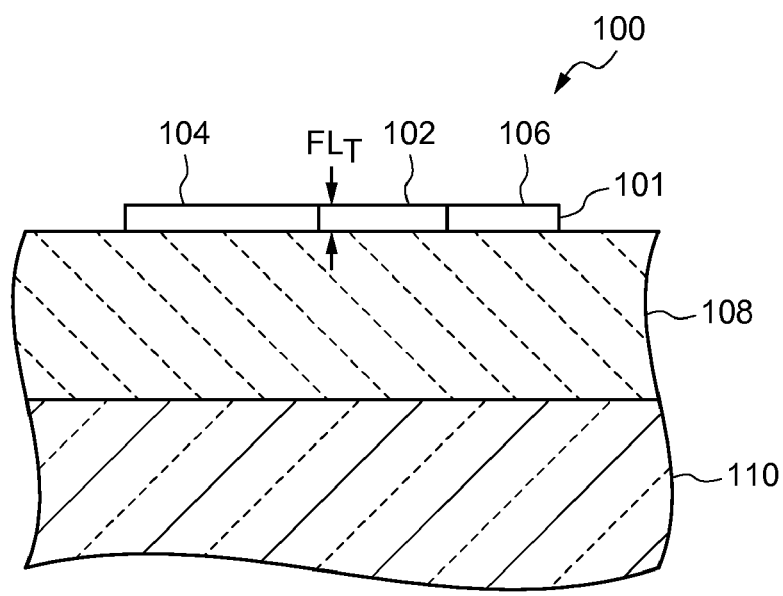
FIG. 1B is a side view of the E-fuse of FIG. 1A.

The E-fuse programming current generator 204 uses an E-fuse reference link array 202 incorporated on the IC 200, rather than an external reference resistor. While the reference link array is shown as being within the current generator, the reference link array is alternatively located elsewhere on the IC outside the current generator. The E-fuse reference link array 202 has a plurality of reference links 218, 220, 222 that in combination provide a reference resistance $R_{REF}$ of the E-fuse reference link array. An E-fuse 224 in the E-fuse cell 206 has an E-fuse link 226 that is programmed ("blown") by programming current from the E-fuse current generator during a programming operation. The E-fuse links and the reference links are each defined in a layer of polysilicon, silicided polysilicon, or other suitable link material ("link layer"). Embodiments may have any of several types of suitable E-fuses, and are not limited to the exemplary E-fuse shown in FIGS. 1A and 1B.

During programming, a fuse programming voltage (typically about 2 to about 4 volts) is supplied to Vfs in the E-fuse cell 206. The switching matrix 210 connects the output 212 of the E-fuse programming current generator 204 to a selected E-fuse cell 206 for a selected programming period, producing a programming pulse $P_{gm}$. The selected programming period and fuse programming voltage is previously determined by characterization of programmed E-fuse memory arrays. Transistor N2 in the E-fuse cell 206 is matched to N1 in the E-fuse programming current generator 204 to form a current-follower. In other words, the current through N1 (which is essentially $I_{P1}$, as discussed above) is equal to the programming current $I_{PGM}$ through N2. N2 draws current $I_{PGM}$ from Vfs to ground (or vice versa), programming the E-fuse link 226.

Although not shown in FIG. 2, program current generator 204 is turned on only during programming operation. Also, $I_{P1}$ may be chosen to be much smaller than $I_{PGM}$ by using a high $R_{REF}$ and by choosing properly sized (i.e., scaled) current mirrors, e.g., P2:P1 and N2:N1 width ratio, heating of the reference link array when sequentially programming several fuse links in a memory array is avoided. Heating of the reference links might otherwise change the resistance of the reference link array during programming. The reference link array 202 may also be made up of several reference links that distribute $I_{P1}$ so that individual link dissipation is not high enough to change its properties. The plurality of reference links in the E-fuse reference link array 202 distribute current between them such that each draws less current than the E-fuse link 226 draws during programming, and therefore the links do not fuse.

The resistance representing the logic value of the E-fuse 224 is sensed (read) using any of several known techniques. Typically, a word line/bit line technique is used to access a selected E-fuse cell (e.g. a READ signal is applied to $N_{R1}$ and $N_{R2}$, and the current Iread_bias through $N_{R1}$, the E-fuse 224, and $N_{R2}$ is sensed and optionally latched by a sense amplifier 230. Such techniques are known in the art of E-fuse memory array READ operations, and a detailed discussion is therefore omitted. The sense amplifier and other components of the READ operation are optionally outside of the E-fuse cell 206 elsewhere on the IC 200.

In a particular embodiment, the E-fuse link 226 is a thin member of polysilicon or silicide (see FIG. 1, ref. num. 102) that provides a relatively low resistance (e.g., about 200 Ohms) before programming, and a higher resistance after programming (e.g., greater than 2,000 Ohms). It is desirable that programmed E-fuses attain a sufficiently high programmed resistance to distinguish between the programmed and unprogrammed states (i.e., between logic values stored in the E-fuse cell 206). E-fuses that fail to attain the specified programmed resistance are considered to be programming failures, and decrease programming yield.

However, the programmed resistance of an E-fuse can be highly sensitive to variations in programming conditions, which in turn can depend on minor variations of the E-fuse link. Variations have been observed between wafer-to-wafer, lot-to-lot, mask-to-mask, and vendor-to-vendor programming yields. In other words, using identical programming conditions for two wafers in a lot or for wafers from different vendors can produce very different programming yields. Such variations are believed to arise from minor process fluctuations and differences, such as polysilicon link photolithography, critical dimension, link processing (e.g., polysilicon etch), polysilicon layer thickness, silicidation, and doping levels.

The reference links are fabricated concurrently with the E-fuse link 226 and other E-fuse links in the E-fuse memory array (not separately shown). The reference links have the same type of link line (i.e., material layer (composition and thickness) and photolithographic definition (i.e., width)) as the E-fuse links. The variations between E-fuse links and reference links due to run-out across the IC are very minor, compared to conventional programming variations. The reference links provide the same material and cross section as a fuse link has, thus a reference link that is the same length as a fuse link not only draws the same current, but also has the same current density.

Furthermore, the plurality of reference links in the E-fuse reference link array 202 averages out variations that occur between individual reference links, making the reference resistance $R_{REF}$ more representative of the fuse links to be programmed. In some embodiments, the E-fuse reference link array is designed to have a reference resistance $R_{REF}$ equal to the pristine (unprogrammed) resistance of an E-fuse link 226; however, this is not the case in alternative embodiments.

Fabricating the E-fuse reference link array 202 on the IC 200, rather than using an external reference resistor, closely matches the thermal conditions of the reference link array 202 to the thermal conditions of the E-fuse memory array 208. Thus, the resistance of the reference link array closely tracks the resistance of an E-fuse link as the ambient conditions of the IC change. The current $I_{P1}$ through $R_{REF}$ establishes $V_{REF}$. The OpAmp and feedback circuit are alternatively configured, such as by using resistors in the feedback loop, so that $V_{REF}$ does not equal $V_{bg}$ at equilibrium, as is known in the art of OpAmp design.

Figure 3A:
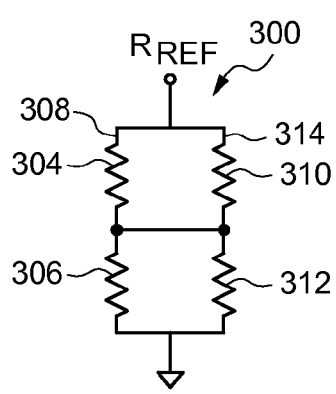
FIGS. 3A-3C are circuit diagrams of reference link groups according to embodiments.
Figure 3B:
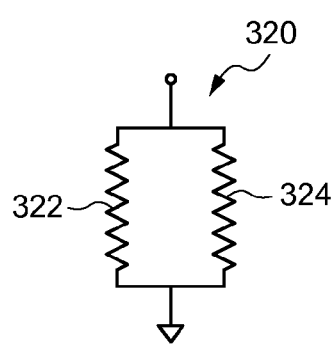
Figure 3C:
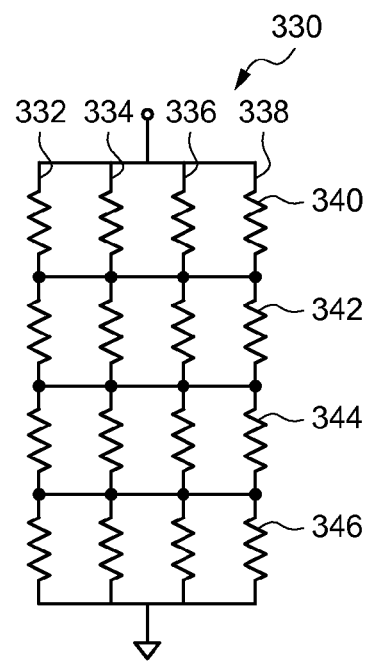

FIGS. 3A-3C are circuit diagrams of reference link groups according to embodiments. Each reference link group is fabricated on an IC with an associated E-fuse memory array also on the IC. FIG. 3A shows a four-link reference link group 300 where two reference links 304, 306 are used in series in a first leg 308, and two reference links 310, 312 are used in series in a second leg 314. Each reference link is fabricated to be essentially identical to the fuse links in the associated E-fuse memory array; thus, the resistance $R_{REF}$ of the reference link group 300 is essentially the same as the pristine resistance of an E-fuse link (see, FIG. 2, ref. num. 226). Each leg carries about one half of the current through the link group, thus each reference link has only half the total reference current flowing through it during a programming operation. Thus, the reference links do not fuse during the programming operation.

If the critical dimension of the E-fuse links varies between vendors, for example, the reference links will similarly vary. The $R_{REF}$ value for the reference link group will insure that the appropriate programming current is generated (i.e., scaled to the fuse links). For example, if the critical dimension of a poly-silicon definition is smaller from a second vendor than from a first vendor, the reference resistance increases due to the smaller cross sectional area (higher resistance) of the reference links, which generates less programming current. However, the current density through the fuse link during programming is appropriate for the reduced fuse link dimension, improving programming yield.

FIG. 3B shows a two-link reference link group 320 according to another embodiment. Each reference link 322, 324 has a similar layer thickness, link width, and link material as the E-fuse links in the associated memory array; however, each reference link length is twice the length of an E-fuse link in the memory array. Thus, each reference link (leg) has a resistance twice the pristine resistance of an E-fuse link, and the reference link group 320 has a resistance essentially the same as the pristine resistance of an E-fuse link. Each reference link carries only half the total reference current during a programming operation.

FIG. 3C shows a multi-link reference link group 330 according to another embodiment. The reference link group has four legs 332, 334, 336, 338. The leg 338 has four reference links 340, 342, 344, 346. The other legs similarly have four reference links in each leg. Each of the reference links is essentially identical to fuse links in an associated E-fuse memory array; thus, the resistance $R_{REF}$ of the reference link group 330 is essentially the same as the pristine resistance of an E-fuse link (see, FIG. 2, ref. num. 226). Each leg carries about one fourth of the current through the link group, thus each reference link has only one-fourth the total reference current flowing through it during a programming operation. Thus, the reference links do not fuse during the programming operation.

Providing multiple reference links in a reference link group averages out minor manufacturing differences (e.g., microscale variation in critical dimension) between links, making the resistance of the reference link group less prone to misrepresentation of the correct fuse link current density during programming. In a particular embodiment, nine reference links in a 3×3 reference link group provides suitable link resistance averaging. In another embodiment, sixteen reference links in a 4×4 reference link group provides suitable link resistance averaging. It is generally desirable to provide at least 24 reference links in a reference link group to average manufacturing variations of links on an IC. It is not necessary that a reference link group have the same number of links in each leg as the number of legs in the group. Similarly, different legs may have different numbers of links. Other configurations and arrangements of links in various legs, links in each leg, and length/width of each link, may also be used, as will be apparent to those of skill in the art.

Figure 4A:
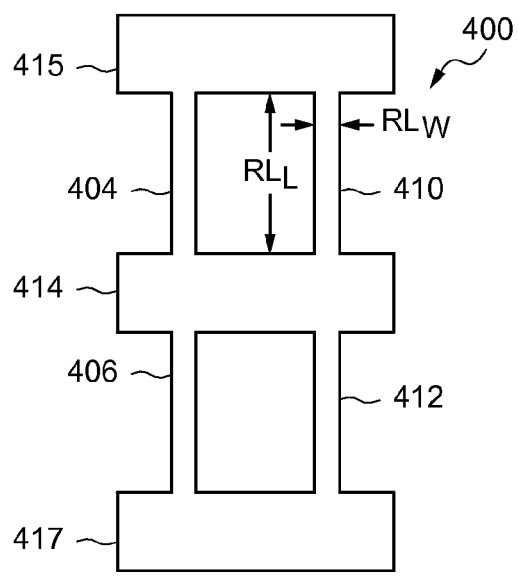
FIGS. 4A-4C are plan views of reference link groups according to embodiments.
Figure 4B:
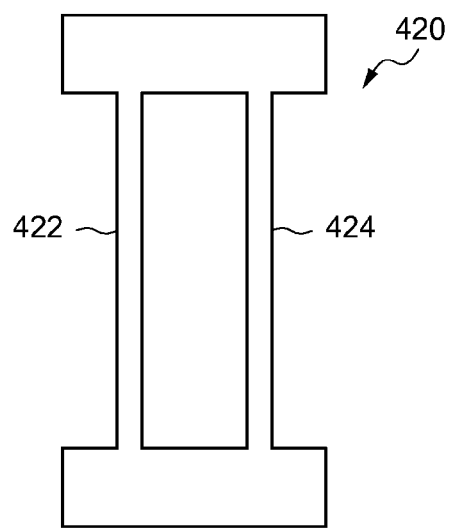
Figure 4C:
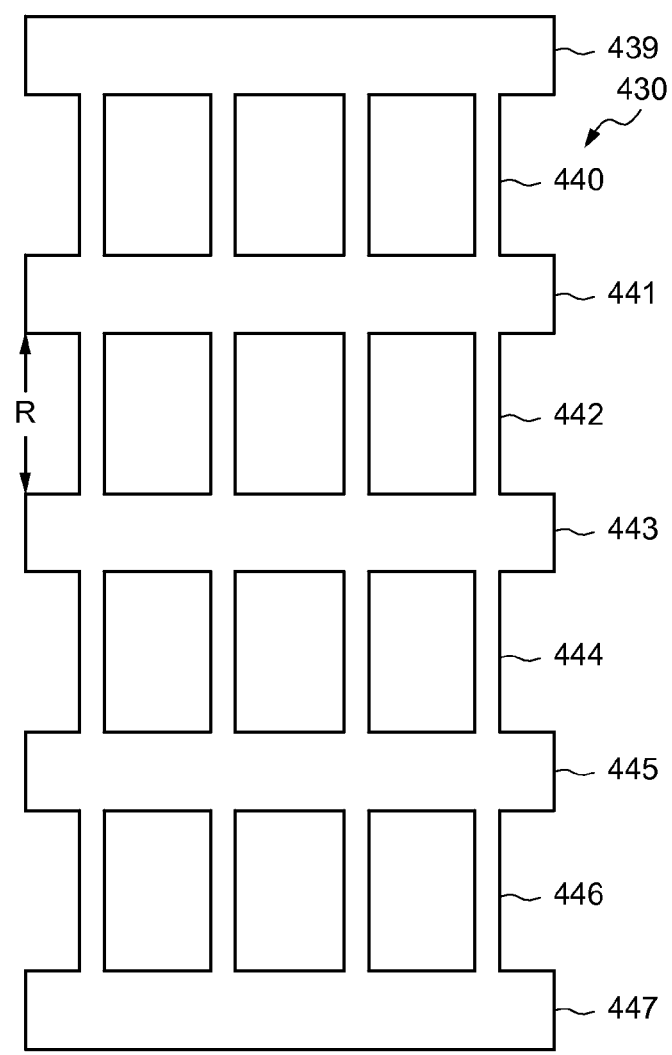

FIGS. 4A-4C are plan views of reference link groups according to embodiments shown in FIGS. 3A-3C. FIG. 4A shows a reference link group 400 that uses reference links 404, 406, 410, 412 substantially identical to the fuse links (e.g., FIG. 1, ref. num. 102) used in an associated E-fuse memory array (see, e.g., FIG. 2, ref. num. 208). The reference links 404, 406, 410, 412 each have a reference link width $RL_w$ and a reference link length $RL_L$ designed to be the same as the fuse link width and fuse link length of an E-fuse (see, FIG. 1, ref. num. 102) in the associated E-fuse memory array. Thus, each of the reference links is made of the same material, and has the same cross sectional area and length of a fuse link.

The bridge 414 between the reference links 404, 406 has much lower resistance than the links, and contributes little to the overall resistance of the reference link array 400. In some embodiments, the resistance of the bridge(s) is accounted for in the layout design, and in other embodiments, it may be ignored because it is inconsequential. In some embodiments, bridges are desirable because long, thin lines of polysilicon are difficult to fabricate in some processes. In particular, the stability of long, thin photoresist features is difficult to control in some processes. Including bridges in reference link arrays with serial reference links avoids photoresist stability issue. Alternatively, fabrication techniques capable of producing long, thin polysilicon features are used. The bridges may be fabricated from polysilicon, silicided polysilicon, or other conductive material.

In a particular embodiment, electrodes 415, 417, reference links 404, 406, 410, 412, and bridge 414 are fabricated from a poly-silicon layer or from a silicided poly-silicon layer used to fabricate the associated fuse links. In other words, the reference link group 400 is contiguously defined in the same layer of poly-silicon or silicided poly-silicon that the E-fuse links of the memory array are defined in. Similarly, the reference link array is fabricated on the same type of field material(s) (e.g., thick field oxide) as the E-fuses are fabricated on.

Alternatively, the bridge 414 or electrodes 415, 417 are different from the material of the links. For example, non-silicided poly fuse links could be used with silicided electrodes and bridges to minimize parasitic resistances. Connecting bridges across legs of a reference link array, such as bridge 414 in FIG. 4A, prevent a single bad reference link from causing a large total resistance variation. In other embodiments, one or more bridges do not connect across legs of a reference link array, but serve to avoid long, thin runs of polysilicon, as discussed above.

FIG. 4B is a reference link array 420 defined in a polysilicon layer, silicided poly-silicon layer, or layer of other material used to define fuse links of E-fuses in a memory array. The reference link array has reference links 422, 424 that are designed to have the same width as E-fuse links, thus providing the same cross section as a fuse link. However, each reference link 422, 424 is twice as long as an associated fuse link, and the intervening bridges are omitted. Omitting the bridges saves silicon area and reduces the parasitic resistance component added by the bridge.

FIG. 4C is a reference link array 430 defined in a polysilicon layer, silicided poly-silicon layer, or other link layer. The reference link array has four legs extending between electrodes 439, 447, each leg having four reference links (e.g., reference links 440, 442, 444, 446 with bridges 441, 443, 445) between the reference links. Each reference link is substantially identical to E-fuse links in an associated E-fuse memory. Thus, the reference link array 430 has sixteen reference links, each having a length, material, and cross section substantially identical to E-fuse links in the memory array. The sixteen reference links average-out minor fabrication variations and reference current stress among many links that might arise between reference links, providing a superior $R_{REF}$ for the reference link array. In a particular embodiment, each leg carries approximately one-fourth of the programming current supplied to an E-fuse link during a programming operation. Alternatively, the reference link array is scaled or scaling factors (e.g., a feedback resistor voltage divider) is used.

Figure 5:
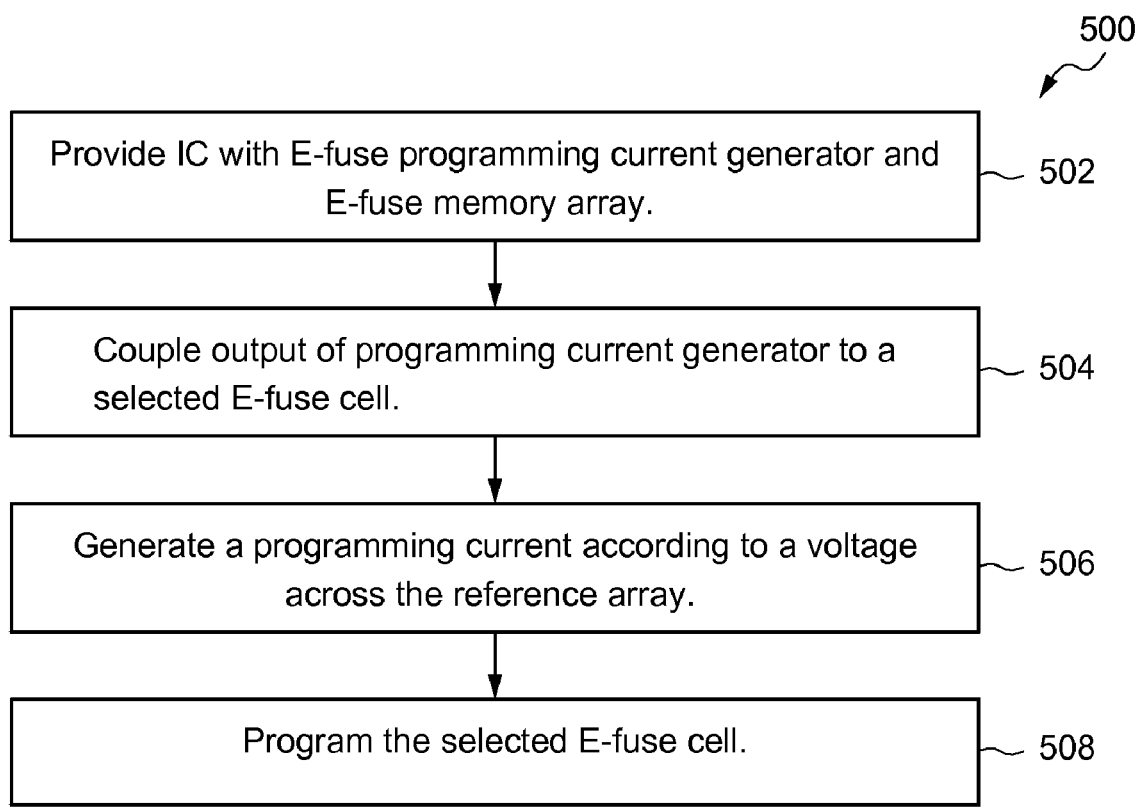
FIG. 5 is a flow chart of a method of programming an E-fuse according to an embodiment.

FIG. 5 is a flow chart of a method of programming an E-fuse 500 according to an embodiment. An IC having an E-fuse memory array with a plurality of E-fuse cells, each E-fuse cell having an E-fuse link defined in a layer(s) of link material(s) and having a fuse link width; and having a fuse link length; and the IC also having an E-fuse programming current generator with a reference link array having a plurality of reference links is provided (step 502). In a particular embodiment, each reference link in the plurality of reference links is defined in the layer(s) of link material(s) and has a reference link width substantially equal to the fuse link width. In a further embodiment, each reference link also has a reference link length substantially equal to the fuse link length.

An output of the E-fuse programming current generator is coupled to an E-fuse cell to be programmed (step 504), and a programming current is generated (e.g. FIG. 2, $I_{PGM}$) according to a voltage developed across the reference link array (step 506) to program the E-fuse cell (step 508). In a particular embodiment, the programming current is generated for a selected period by coupling the output to the E-fuse cell for the selected period. In a particular embodiment, a reference current essentially equal to the programming current is generated in the programming current generator.

In a particular embodiment, an output transistor (e.g., FIG. 2, $N_1$) forms a current mirror with a programming transistor (e.g., FIG. 2, $N_2$ in the E-fuse cell). In a particular embodiment, the output of the E-fuse programming current generator is coupled to the E-fuse cell through a switching matrix of a field programmable gate array ("FPGA"). In a particular embodiment, the reference link array has a reference resistance essentially equal to a pristine fuse link resistance. In a further embodiment, the reference resistance is an average of a plurality of reference links wherein each of the reference links has a reference link resistance essentially equal to a fuse link resistance. In a particular embodiment, each of the reference links in the reference link array has a reference link resistance of about 200 Ohms.

In a particular embodiment, a reference current (e.g., FIG. 2, $I_{P1}$) essentially equal to the programming current flows through a reference link array having a reference resistance essentially equal to a pristine fuse link resistance to develop a reference voltage (e.g., FIG. 2, $V_{REF}$) that is connected to a first input of an OpAmp. A second input of the OpAmp is connected to a voltage source, such as a band gap voltage source (e.g., FIG. 2, $V_{bg}$). An output of the OpAmp controls a first gate of a first transistor (e.g., FIG. 2, $P_1$) and also a second gate of a second transistor (e.g., FIG. 2, $P_2$), the second transistor being matched to the first transistor. The reference current flows through the first transistor and through the reference array.

Figure 6:
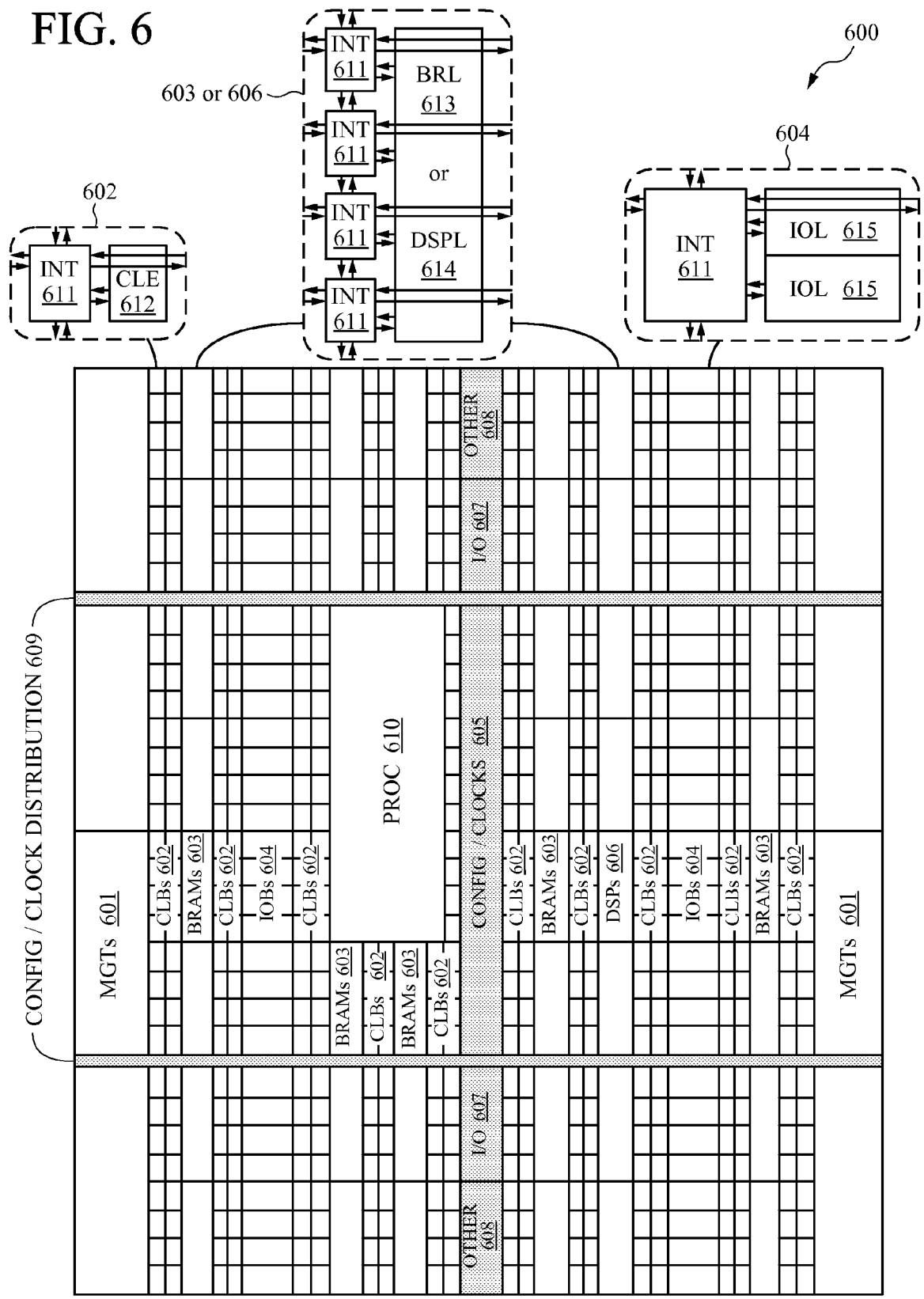
FIG. 6 is a plan view of an FPGA according to an embodiment.

FIG. 6 is a plan view of an FPGA 600 according to an embodiment. The FPGA includes CMOS portions in several of the functional blocks, such as in RAM and logic, and is fabricated using a CMOS fabrication process. E-fuses programmed according to one or more embodiments of the invention are incorporated in any of several functional blocks of the IC, such as a memory block, logic block, I/O block, clock circuit, transceiver, or other functional block; within many functional blocks; or within a physical section or segment of the FPGA 600. The FPGA also has at least one E-fuse programming current generator a reference link array. In a further embodiment, the FPGA has a variety of types of E-fuses (e.g., different memory arrays use different types of E-fuses), and a plurality of E-fuse programming current generators, each programming current generator having a reference link array with reference links appropriate for use with the type of E-fuse in the associated memory array.

E-fuses programmed according to one or more embodiments of the invention are particularly desirable for non-reconfigurable, NV memory applications, such as serial numbers, storing security bits that disable selected internal functions of the FPGA, bit-stream encryption key storage, storing repair information for circuits having redundancy blocks, or to provide a user general-purpose one-time programmable NV user-defined bit storage.

The FPGA architecture includes a large number of different programmable tiles including multi-gigabit transceivers (MGTs 501), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615. In the pictured embodiment, a columnar area near the center of the die (shown shaded in FIG. 6) is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts and cross-sections of MOS fuses could be alternatively used, and alternative sensing circuitry can be used. Therefore, the spirit and scope of the appended claims should not be limited to the foregoing description.

The invention claimed is:

1. An integrated circuit ("IC") comprising:
    an electronic fuse ("E-fuse") cell having a fuse link with a fuse link width and a fuse link thickness, the fuse link being fabricated from a layer of link material;
    an E-fuse programming current generator including a reference link array having a plurality of reference links, each of the reference links having the fuse link width and the fuse link thickness and being fabricated from the layer of link material,
    wherein the E-fuse programming current generator generates a programming current according to a voltage developed across the reference link array.

2. The IC of claim 1 wherein the fuse link has a fuse link length and each of the reference links has the fuse link length.

3. The IC of claim 1 wherein fuse link has a fuse link resistance and the reference link array has the fuse link resistance.

4. The IC of claim 1 wherein the reference link array has a first leg with a first reference link, a second reference link, and a bridge between the first reference link and the second reference link.

5. The IC of claim 4 further comprising a second leg with a third reference link and a fourth reference link, the bridge connecting the first leg to the second leg between the third reference link and the fourth reference link.

6. The IC of claim 1 wherein the E-fuse programming current generator further includes an operational amplifier having a first input, a second input, and an output, the first input being connected to a voltage source, the second input being connected to a node of the reference link array, and the output being connected to a first gate of a first transistor so as to produce a first current through the first transistor and through the reference link array so as to establish a reference voltage at the node.

7. The IC of claim 6 wherein the E-fuse programming current generator further includes a second transistor having a second gate, the second gate being connected to the output of the operational amplifier so as to produce a second current through the second transistor, the second current being a programming current suitable for programming the fuse link.

8. The IC of claim 7 wherein the E-fuse programming current generator further includes a third transistor and wherein the E-fuse cell further includes a fourth transistor, the third transistor being configured to form a current mirror with the fourth transistor, the fourth transistor being configured to conduct a programming current during programming of the fuse link.

9. The IC of claim 1 further comprising a memory array having a plurality of E-fuse cells and a switching matrix between the E-fuse programming current generator and the memory array, the switching matrix selectively connecting an output of the E-fuse programming current generator to a selected E-fuse cell.

10. The IC of claim 9 wherein the IC is a field programmable gate array, and the E-fuse cell is programmed to store a bit of a serial number, a security code disabling a selected internal function, a bit-stream encryption key, block repair information, or user-defined value in the field programmable gate array.

11. The IC of claim 1 wherein the layer of link material comprises at least one material selected from the group consisting of polysilicon and silicide.

12. A method of programming an electronic fuse ("E-fuse") comprising:
    providing an IC having an E-fuse memory array with a plurality of E-fuse cells, each E-fuse cell having an E-fuse link having a fuse link width and a fuse link length; the IC further having an E-fuse programming current generator with a reference link array having a plurality of reference links;
    coupling an output of the E-fuse programming current generator to a selected E-fuse cell of the E-fuse memory array;
    generating a programming current according to a voltage developed across the reference link array; and
    programming the selected E-fuse cell with the programming current.

13. The method of claim 12 wherein an output transistor of the E-fuse programming current generator forms a current mirror with a programming transistor of the E-fuse cell, the programming current flowing through the programming transistor during programming.

14. The method of claim 12 wherein the IC a field programmable gate array ("FPGA") having a switching matrix and the step of coupling the output of the E-fuse programming current generator to the E-fuse includes coupling the output to the E-fuse through the switching matrix.

15. The method of claim 14 wherein the selected E-fuse cell is programmed to store a bit of a serial number, a security code disabling a selected internal function, a bit-stream encryption key, block repair information, or user-defined value in the FPGA.

16. The method of claim 12 wherein the reference link array has a reference resistance equal to a pristine fuse link resistance.

17. The method of claim 16 wherein the reference resistance is an average of reference link resistances wherein each of the reference links has a reference link resistance equal to the pristine fuse link resistance.

18. The method of claim 12 wherein each of the reference links in the reference link array has a reference link resistance of about 200 Ohms.

19. The method of claim 12 wherein each reference link in the plurality of reference links is defined in a layer of link material and has a reference link width equal to the fuse link width.

20. The method of claim 19 wherein each reference link has a reference link length equal to the fuse link length.

* * * * *